United States Patent [19]

Collar et al.

[11] Patent Number: 4,647,729
[45] Date of Patent: Mar. 3, 1987

[54] CIRCUIT BOARD WITH CONTACT POSITIONS, AS USED FOR TELECOMMUNICATIONS TERMINALS AND OTHER APPARATUS

[75] Inventors: Geoffrey A. Collar; John S. Moss, both of Ottawa; Pak-Jong Chu; Paul D. McDonald, both of Nepean; Brian E. Voss, Woodlawn, all of Canada

[73] Assignee: Northern Telecom Limited, Montreal, Canada

[21] Appl. No.: 785,114

[22] Filed: Oct. 7, 1985

[51] Int. Cl.[4] .................. H01H 9/00; H01H 13/70
[52] U.S. Cl. ........................ 200/5 A; 200/159 B; 200/292
[58] Field of Search ............ 200/5 R, 5 A, 159 B, 200/266, 267, 268, 292; 174/68.5; 361/397, 400, 402, 403, 404, 405, 406, 409

[56] References Cited

U.S. PATENT DOCUMENTS

| | | | |
|---|---|---|---|
| 3,504,098 | 3/1970 | Clark | 200/292 X |
| 3,760,137 | 9/1973 | Shimojo et al. | 200/5 A X |
| 3,860,771 | 1/1975 | Lynn et al. | 200/5 A |
| 4,045,636 | 8/1977 | Yoder et al. | 361/397 X |
| 4,296,272 | 10/1981 | Schelhorn | 361/402 |
| 4,328,399 | 5/1982 | Perks et al. | 361/397 X |
| 4,423,294 | 12/1983 | Walser et al. | 200/5 A |
| 4,451,714 | 5/1984 | Eventoff | 200/5 A |
| 4,527,021 | 7/1985 | Morikawa et al. | 200/5 A |

Primary Examiner—J. R. Scott
Attorney, Agent, or Firm—Sidney T. Jelly

[57] ABSTRACT

A circuit pattern on a circuit board, as used in telecommunications systems and other electrical apparatus, often has contact positions for switches, such as pushbutton switches, and for other purposes. The normal copper circuit pattern is covered at the contact positions to give improved contact conditions. Carbon ink has been proposed by obtaining the necessary high level of alignment of carbon ink with the copper pattern at contact positions is difficult as such contact positions have very close members. The invention proposes contact positions having closely spaced inter-digital contact members, in which the circuit pattern extends to and stops at the peripheral region of a contact position, the contact members being of carbon ink and overlapping conductors of the circuit pattern at the peripheral region.

14 Claims, 14 Drawing Figures

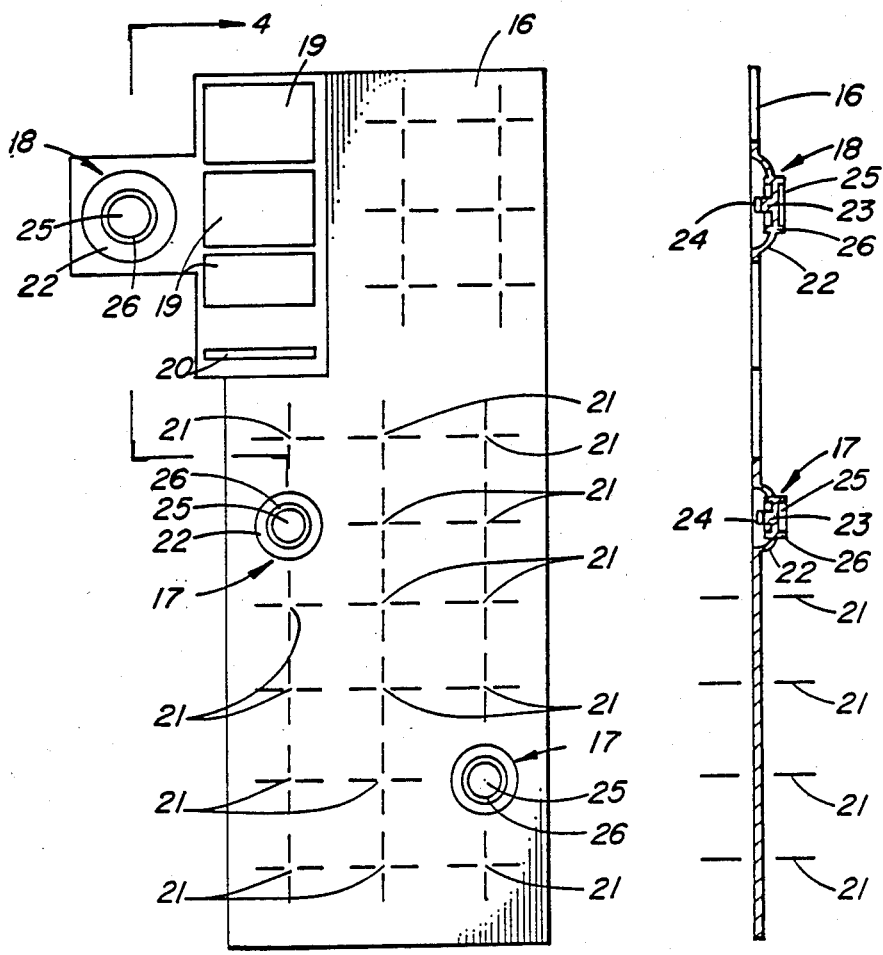
FIG. 3
FIG. 4
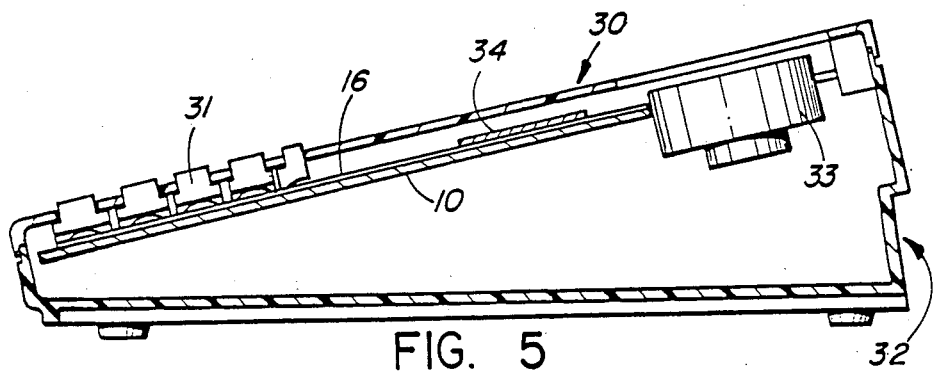
FIG. 5

CIRCUIT BOARD WITH CONTACT POSITIONS, AS USED FOR TELECOMMUNICATIONS TERMINALS AND OTHER APPARATUS

BACKGROUND OF THE INVENTION

This invention relates to a circuit board and in particular is concerned with contact positions on a circuit board, the contact positions comprising a plurality of closely spaced inter-digital contact members.

Circuit boards, as used in terminals and other forms of electrical and electronic apparatus, typically telephone sets as an example, have circuit patterns which include contact positions. Such contact positions may be switch positions for pushbuttons as for a telephone dial, or for other switches. Contact positions may also be provided for contact by contact members on display devices, such as liquid crystal displays, and other devices.

Such contact positions, for various reasons, may be composed of a closely spaced plurality of inter-digital contact members. The close spacing of the contact members gives rise to production difficulties with conventional production procedures. Normally, the circuit pattern is of copper. To avoid oxide problems and for other reasons, at appropriate places, for example at contact positions, the copper is plated with gold, with an underlayer of nickel between the gold and the copper. The use of gold is expensive and it has been proposed to use a carbon ink, applied via a screen printing procedure. This has become possible because the provision of a very low resistance contact is no longer a necessity, with recent advances in technology.

However, when coating with carbon ink over copper, problems arise in obtaining accurate register between layers. With very closely spaced contact members, quite a small misalignment between the copper pattern and the carbon ink can result in electrical shorting between contact members.

SUMMARY OF THE INVENTION

The present invention avoids the problem of alignment by stopping the copper conductor pattern short, the copper extending only to a peripheral region of a contact position, the contact members being formed by carbon ink deposited directly on the circuit board, the carbon ink overlapping the copper conductor at the peripheral region.

Such an arrangement is particularly suitable for use in telephone sets and similar terminals where a single circuit board can be used for both switch positions and other contact positions, and also mount the electrical and electronic components for the circuitry. The use of an elastomeric contact member overlay which acts as a switch contact member provides a particularly convenient assembly.

In its broadest aspect, the present invention comprises a circuit board having a metallic circuit pattern thereon, the circuit pattern including a plurality of contact positions, the contact positions having a plurality of closely spaced inter-digital contact members, in which the metallic circuit pattern extends to and stops at a peripheral region of a contact position, the contact members being of carbon ink deposited on the circuit board and overlapping the metallic circuit pattern at the peripheral region.

The invention also comprises a circuit board assembly including a metallic circuit pattern on one surface, the circuit pattern including a plurality of contact positions, each having a plurality of closely spaced inter-digital contact members, in which the metallic circuit pattern extends to, and stops at, the peripheral region of each contact position, the contact members being of carbon ink deposited on the surface of the circuit board and overlapping the metallic circuit pattern at the peripheral region, and circuit components mounted on the other surface of the circuit board and connected to the metallic circuit pattern. The invention further comprises a terminal having top and bottom housings and the circuit board mounted in the top housing and having an elastomeric switch member in contact with the one surface of the circuit board carrying the contact positions.

BRIEF DESCRIPTION OF THE DRAWINGS

The invention will be readily understood by the following description of certain embodiments, by way of example, in conjunction with the accompanying drawings, in which:

FIG. 3 is a bottom plan view of an elastomeric switch member, as can be used in conjunction with the circuit board of FIG. 1;

FIG. 4 is a cross-section on the line IV—IV of FIG. 3;

FIG. 5 is a vertical cross-section through a telephone set embodying the invention;

DETAILED DESCRIPTION OF THE PREFERRED EMBODIMENTS

Figure 1:
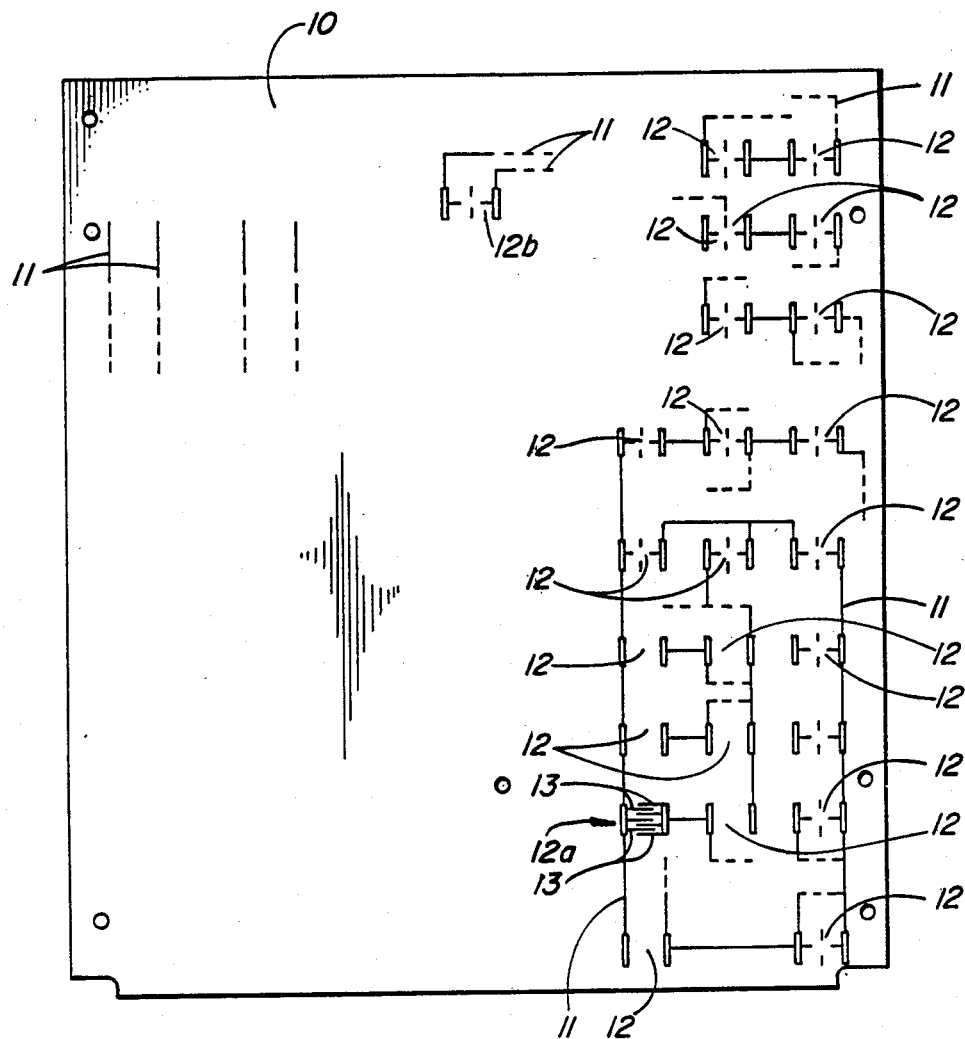
FIG. 1 is a view on one surface of a circuit board, the surface being the one carrying the metallic conductor circuit Pattern.
Figure 2:
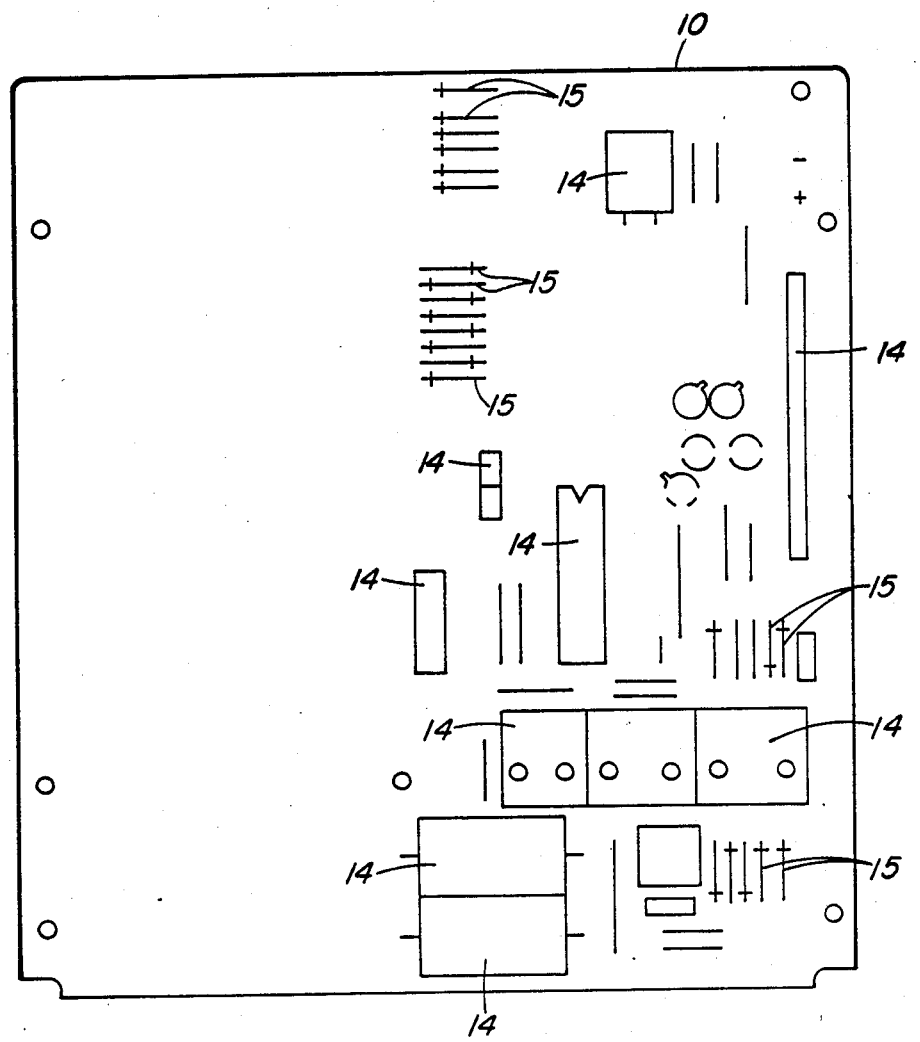
FIG. 2 is a view on the other surface of the circuit board of FIG. 1.

As illustrated in FIGS. 1 and 2, a circuit board 10, often referred to as a printed circuit board (PCB), has an electrically conductive circuit pattern on one surface, for convenience referred to herein as the top surface. The circuit pattern is usually metallic, for example copper, and is indicated generally at 11 in FIG. 1. The circuit pattern normally extends over the entire board but is only partly shown in FIG. 1 for clarity. A circuit pattern can include contact positions comprising a plurality of closely spaced inter-digital contact members. In FIG. 1, a plurality of switch positions 12 are illustrated. Each switch position has a plurality of closely spaced inter-digital contact members, one switch position 12a being shown with contact members 13. The other switch positions 12 also have contact members. Some of the switch positions provide a pushbutton dial facility while other switch positions are for pushbuttons which provide other services, such as repertory dialing, call forwarding, conferencing and such. A hook switch position 12b can also be provided.

FIG. 2 shows the other surface of the board, for convenience referred to as the bottom surface. On this surface are mounted various components, some of which are indicated at 14, while the positions for other components are indicated at 15.

FIG. 3 is a top plan view of an actuating member, or switch member, 16 as can be used with the circuit board as in FIG. 1. The member 16, in the example, is an elastomeric member having a plurality of pushbutton switch members 17 and a hook switch member 18. Mounting positions for lighted displays, for example liquid crystal devices, are provided at 19 with a contact position for the displays at 20. Only two switch members 17 are shown in detail, similar members being provided at all positions 21. Each switch member, 17 and 18, is in the form of a flexible domed member 22 having a central projection 23. The domed member extends away from the circuit board, that is, concave on the side presented to the board, and the projection 23 extends towards the board. At its end surface, the projection is provided with a layer of electrically conductive material 24. A central recess 25 is provided on the convex side of the domed member, to form an annular ring 26.

As stated, a particular use of the circuit board, together with a switch member as in FIGS. 3 and 4, is in a telephone set or other terminal. FIG. 5 is a vertical cross-section through a telephone set base in which a circuit board, as in FIGS. 1 and 2, is mounted in a top housing 30. Also indicated are pushbuttons 31. The bottom housing 32, a ringer and a 33, a liquid crystal device 34.

Figure 6:
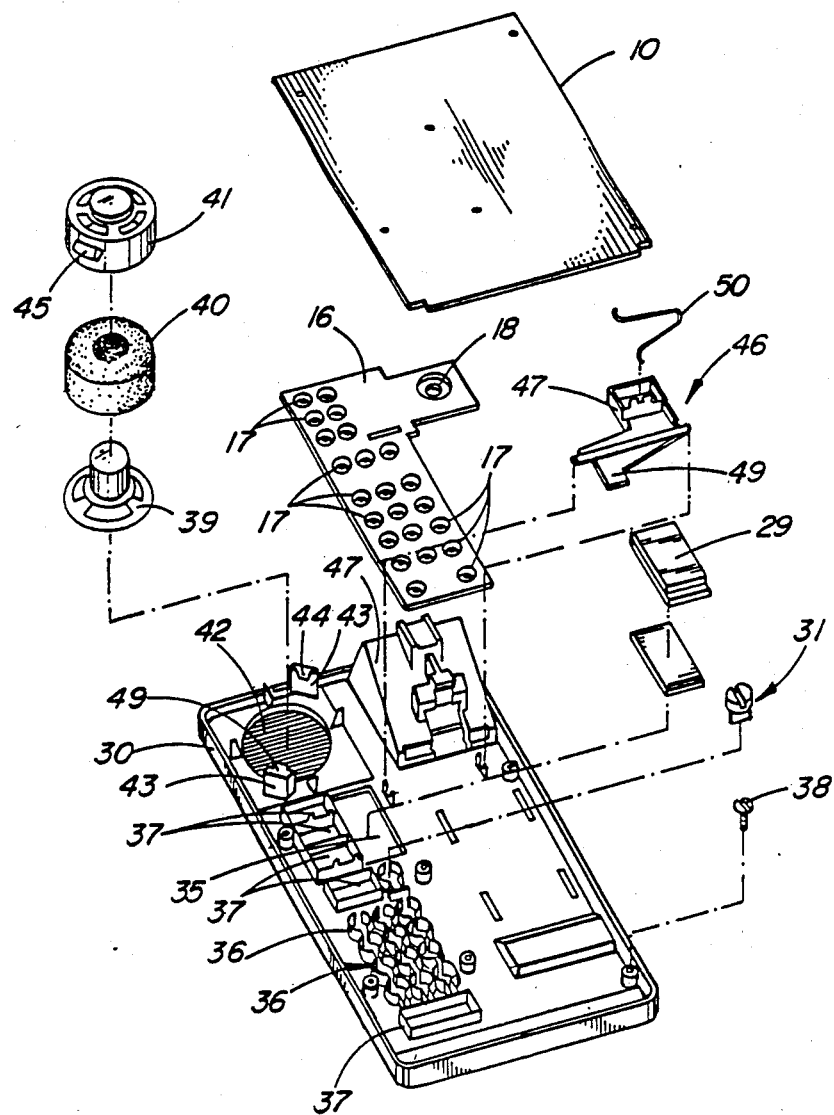
FIG. 6 is an exploded perspective view of the top housing of the telephone set in FIG. 5.

The sub-assembly of the top housing, or cover, 30, is illustrated in FIG. 6. A position for lighted indicators is indicated at 35, housings 36 for pushbuttons, one pushbutton 31 being shown. A lighted indicator 29 is shown. Further elongate pushbuttons can be provided at positions 37. An elastomeric member 16, with switch members 17 and 18, and the circuit board 10 rest on the inner surface of the top housing, secured by screws, one illustrated at 38. The ringer is shown, comprising a speaker 39, a foam washer 40 and a housing 41. The ringer assembly is mounted against a grill 42 via brackets 43 having ribs 44 which interengage with protrusions 45 on the housing 41. A hook switch actuator 46 is mounted on the top housing and has a lever 47 which projects into the recess 48 which receives the transducer housing of the handset, the handset pushing on the arm to actuate the actuator. An arm 49 extends over the hook switch member 18 of the elastomeric member 16. A spring 50 biases the actuator 46.

Figure 8:
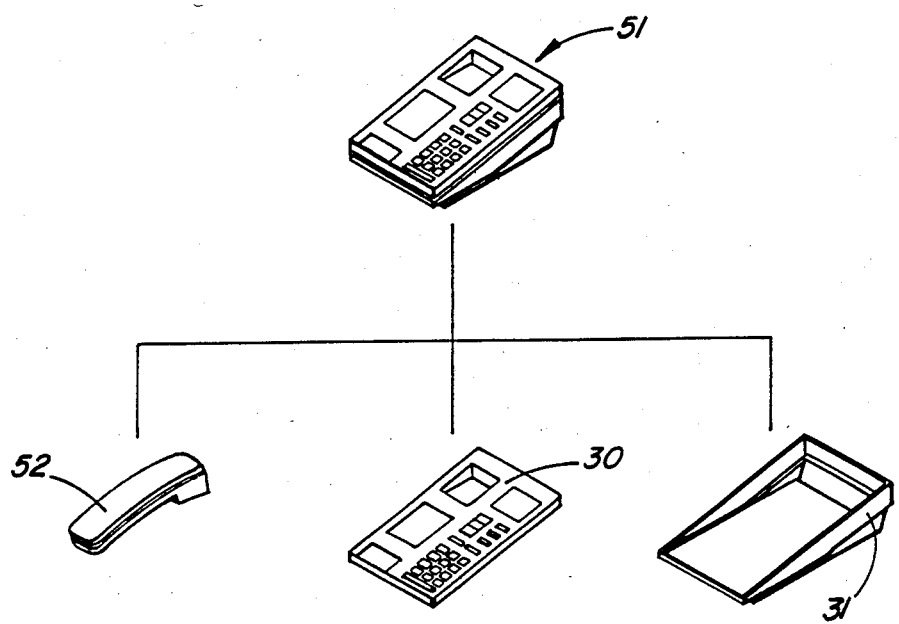
FIG. 8 is an exploded perspective view showing the various parts of a telephone set base.
Figure 7:
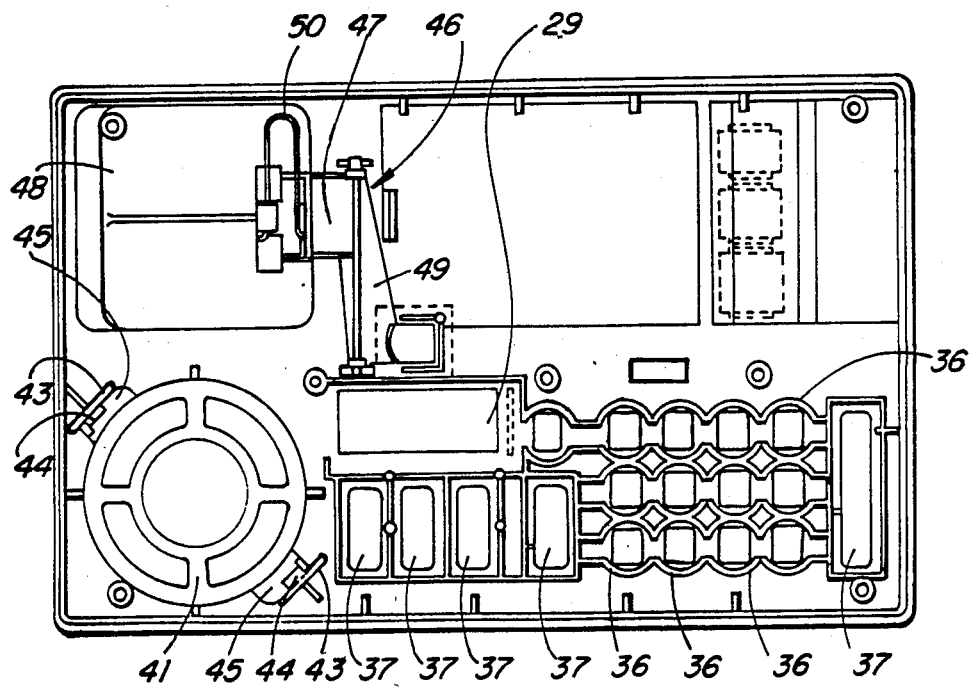
FIG. 7 is an inverted plan view of the assembled top housing of FIG. 6.

FIG. 7 illustrates the assembly of the various items in FIG. 6, omitting the elastomeric member 16 and board 10. FIG. 8 illustrates a typical telephone set 51 and the associated parts—bottom housing 31, top housing 30 with the various items and components mounted therein, and a handset 52.

Figure 9:
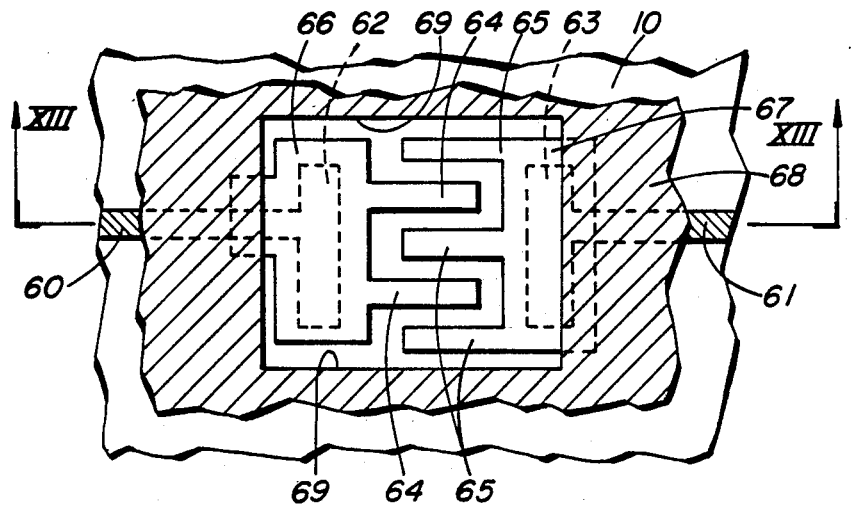
FIGS. 9, 10, 11 and 12 are plan views illustrating various forms of contact member arrangements, in accordance with the present arrangement.
Figure 10:
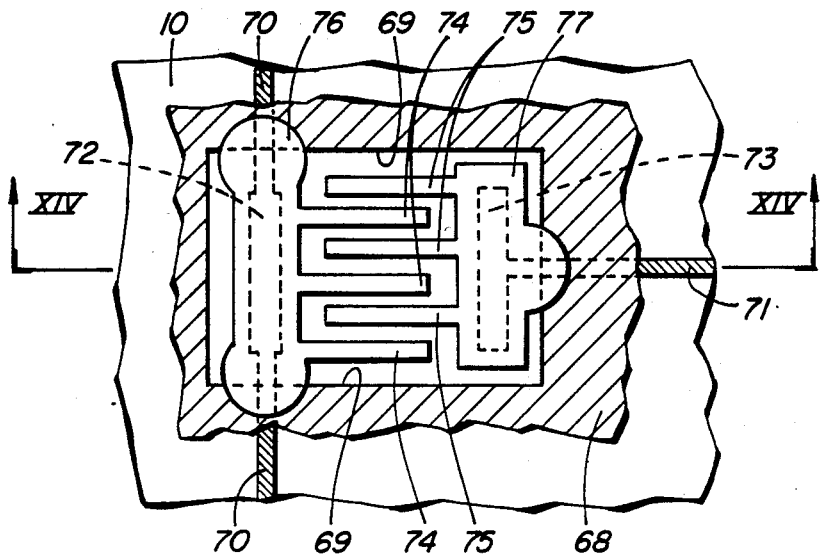
Figure 11:
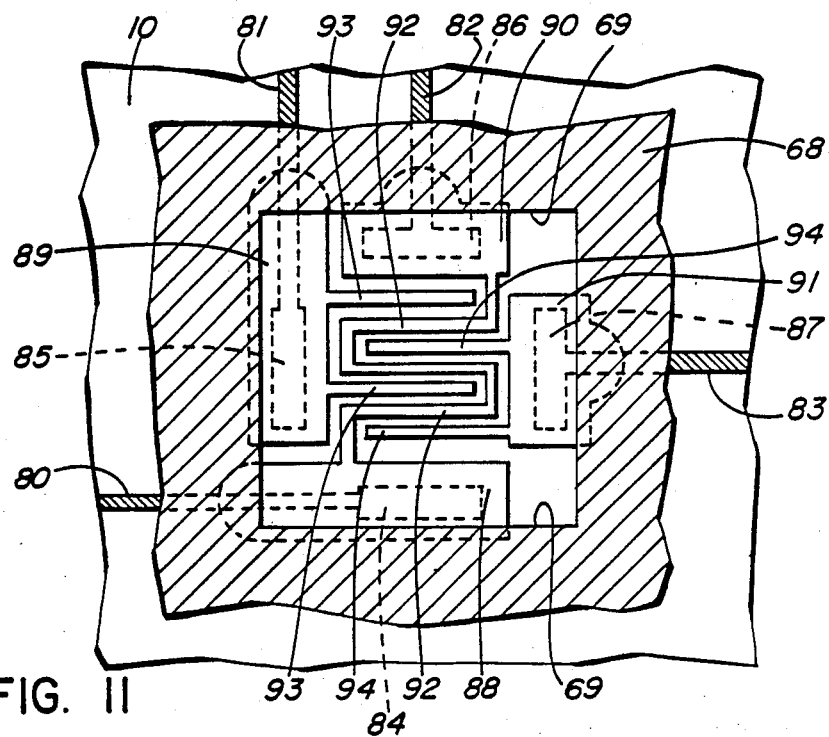
Figure 12:
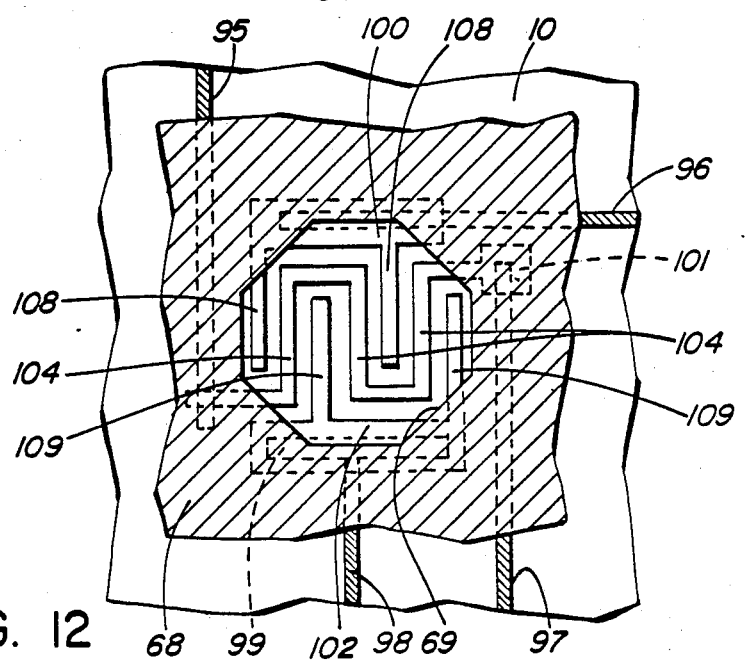

The form of the inter-digital contact members can vary considerably. FIGS. 9, 10, 11 and 12 illustrate some forms, as an example. FIGS. 9 and 10 illustrate contact member arrangements in which contact members connected to two conductors are interleaved for interconnection by a further member, and FIGS. 11 and 12 illustrate contact member arrangements in which contact members are connected to four conductors. Other variations will be appreciated from the following descriPtion and also from the FIGS. 13 and 14, which are cross-sections on FIGS. 9 and 10.

FIG. 9 illustrates a simple arrangement, in which two conductors, 60 and 61, part of a circuit pattern as at 11 in FIG. 1, each end in an elongate pad 62 and 63. The conductors 60 and 61 and the pads 62 and 63 are typically of copper. Contact members extend from the pads 62 and 63 and have inter-digital finger-like members 64 and 65. The members 64 and 65 extend from elongate pads 66 and 67 extending over pads 62 and 63. The contact members comprising the members 64 and 65 and pads 66 and 67 are of carbon, formed by carbon ink deposited on the circuit board 10. It is normal to cover the circuit pattern on a circuit board with a thin layer of resist, which is a dielectric, windows being left in the resist layer at a contact position. The resist layer may be applied before or after deposition of the carbon ink. In some conductor member patterns, the resist layer can be applied before or after deposition of the carbon ink. In other patterns, the resist layer is applied before the carbon ink and in further patterns the resist layer is applied after the carbon ink. In the arrangement, or pattern in FIG. 9, the resist layer, indicated at 68, can be applied before or after the carbon ink, and has been shown as applied after deposit of the carbon ink, the window periphery being seen at 69.

FIG. 10 illustrates an arrangement or pattern in which two conductors 70 and 71 each have an elongate pad 72 and 73. Conductor 70 in this example is a continuous conductor with the pad 72 at an intermediate position. Conductors 70, 71 and pads 72 and 73 are again of copper and contact members having inter-digital members 74 and 75 extending from pads 76 and 77 extend from the conductors 70 and 71. In this example, the resist layer 68 is shown applied before the deposition of the carbon ink to form the members 74 and 75 and pads 76 and 77, although it can be applied after.

FIG. 11 illustrates a more complex pattern of conductors and contact members. In this pattern, there are four conductors 80, 81, 82 and 83. Each has an elongate pad 84, 85, 86 and 87. Over each pad 84, 85, 86 and 87, which are of copper typically, is deposited a pad 88, 89, 90 and 91, of carbon ink. Conductors 80 and 82 are connected by a continuous contact member 92, of a sinuous or zig zag pattern, extending between pads 88 and 90. From pad 89 extend members 93 and from pad 91 extend members 94. Members 92, 93 and 94 form an inter-digital, or interleaved, pattern. In this example, the resist layer 68 is applied after deposition of the carbon ink.

FIG. 12 is a further example of a more complex conductor and contact member pattern. In FIG. 12, there are four conductors 95, 96, 97 and 98, but enlarged pads are not formed at the conductor ends. The end of conductor 98 extends laterally to provide a wide connection portion 99. Carbon ink pads 100 and 101 and 102 are formed at the ends of the conductors 96, 97 and 98. Conductors 95 and 97 are connected by a contact member 104, which has a pad 101 at one end, for conductor 97, but merely overlaps the end of conductor 95. Pads 101 and 102 are formed over the ends of conductors 96 and 98 and contact members 108 and 109 extend from these pads. Contact member 104 is of sinuous form and contact members 108 and 109 are inter-digital, or interleaved, with contact member 104. In this example, the resist layer 68 is shown deposited after deposition of the carbon ink for pads 100, 101 and 102 and contact members 104, 108 and 109, but can be deposited before the carbon ink. Somewhat similar patterns as in FIGS. 11 and 12 can be used with these conductors. Thus, for example one of the conductors 81 and 83 or 96 and 98 can be omitted, together with the associated contact member, leaving a sinuous member 92 or 104 and one other contact member.

Figure 13:
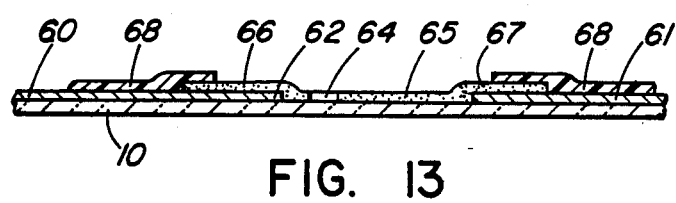
FIGS. 13 and 14 are cross-sections on the lines XIII—XIII ane XIV—XIV of FIGS. 9 and 10 respectively.
Figure 14:
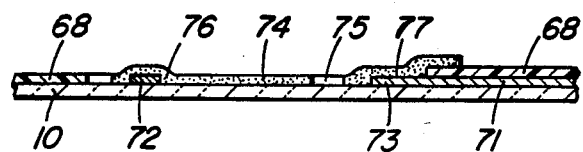

FIGS. 13 and 14, cross-sections through the arrangements of FIGS. 9 and 10, illustrate the layer arrangements. The thickness of the layers, and particularly the relative thickness, are exaggerated and not to scale, to provide clarity.

As can be appreciated from FIGS. 9, 10, 11 and 12, the particular pattern, or arrangement, of the carbon contact members and associated copper conductors can vary considerably. In all examples, the copper conductors extend only to a peripheral area of a contact position where acceptable spacing can readily be provided. While a local enlargement or pad can be provided on a conductor, this is not essential. The contact members themselves are of carbon formed by depositing carbon ink, for example by screen printing. While a corresponding pad of carbon can be provided, over a copper pad, this also is not essential. In certain circumstances, however, the provision of pads on the conductor, contact members, or both, can provide a reduction in alignment requirements. In any arrangement, the only alignment necessary is that between carbon ink and the conductor and the limitations at these positions are much less restrictive than are necessary when applying carbon ink over copper to form the actual inter-digital contact members. As the contact member patterns are applied at one step, alignment between the two sets of inter-digital contact members is assured. Thus very close spacing can be obtained. The inter-digital pattern, and close spacing, is used to ensure good contact by a contact member such as a pushbutton, independent of any possible tilting of a pushbutton during operation.

What is claimed is:

1. A circuit board for electrical and electronic apparatus, said circuit board having a metallic circuit pattern extending over at least one surface, said circuit pattern including a plurality of contact positions, each contact position having contact members comprising a plurality of closely spaced inter-digital members, said metallic circuit pattern extending to and stopping at a peripheral region of said contact position, said contact members being formed of carbon ink deposited on said surface and overlapping the metallic circuit pattern at the peripheral region.

2. A circuit board as claimed in claim 1, including a contact position comprising two conductors of said circuit pattern extending to said peripheral region and a contact member comprising an overlay connected to each conductor, said contact members each including a pad member overlapping said conductor and a plurality of members extending from the pad member, the members from one pad member being interposed between the members from the other pad member to form said plurality of closely spaced inter-digital members.

3. A circuit board as claimed in claim 2, at least one of said conductors terminating in an elongate pad, the pad member of a contact member overlapping the elongate pad.

4. A circuit board as claimed in claim 3, each said conductor terminating in an elongate pad, said elongate pads spaced apart on opposite sides of said contact position.

5. A circuit board as claimed in claim 1, including a layer of dielectric material extending over said circuit pattern and including windows in the dielectric layer at each contact position to expose said contact members.

6. A circuit board as claimed in claim 5, said layer of dielectric material applied to said circuit board before deposit of the carbon ink.

7. A circuit board as claimed in claim 5, said layer of dielectric material applied to said circuit board after deposit of the carbon ink.

8. A circuit board as claimed in claim 1, including two conductors extending to the peripheral region of a contact position, the conductors on opposite sides of said contact position; a contact member connecting said two conductors and including a member having a sinuous form having a series of spaced parallel portions to provide a first inter-digital pattern; a further conductor extending to the peripheral region at a position between the said two conductors, and a contact member connected to said further conductor and including members extending between said spaced parallel portions to form a second inter-digital pattern.

9. A circuit board as claimed in claim 1, including a plurality of electronic components mounted on the other surface of the circuit board, said components connected to said metallic circuit pattern.

10. A circuit board as claimed in claim 1, including a plurality of said contact positions arranged in columns and rows, the contact positions forming switch positions for actuation by pushbuttons.

11. A circuit board as claimed in claim 10, including an actuating member assembled to said one surface over said metallic circuit pattern, said actuating member including a plurality of switching members, each switch member being aligned with a contact position and each said switch member including a conductive portion adapted to make bridging contact with said spaced inter-digital members of said contact members at said contact position.

12. A circuit board as claimed in claim 11, said actuating member being in the form of an elastomeric member.

13. A circuit board as claimed in claim 11, said plurality of switch members including a first series arranged in columns and rows.

14. A circuit board as claimed in claim 13, including a second series of switch members.

* * * * *